(12) United States Patent
Jang et al.

(10) Patent No.: US 8,018,040 B2
(45) Date of Patent: *Sep. 13, 2011

(54) SHIELDED STACKED INTEGRATED CIRCUIT PACKAGING SYSTEM AND METHOD OF MANUFACTURE THEREOF

(75) Inventors: Ki Youn Jang, Ichon-si (KR); YoungMin Kim, Ichon-si (KR); Hyung Jun Jeon, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/423,320

(22) Filed: Apr. 14, 2009

(65) Prior Publication Data

US 2009/0194853 A1 Aug. 6, 2009

Related U.S. Application Data

(63) Continuation of application No. 11/615,922, filed on Dec. 22, 2006, now Pat. No. 7,537,962.

(51) Int. Cl.
*H01L 23/02* (2006.01)
(52) U.S. Cl. ......... 257/686; 257/724; 438/109; 438/121
(58) Field of Classification Search .................. 257/686, 257/724, E21.502, E23.114; 438/109, 121
See application file for complete search history.

(56) References Cited

U.S. PATENT DOCUMENTS

| | | | |
|---|---|---|---|
| 6,201,302 B1 | 3/2001 | Tzu | |
| 6,490,173 B2 | 12/2002 | Perkins et al. | |
| 6,562,655 B1 | 5/2003 | Glenn et al. | |
| 6,734,045 B2 | 5/2004 | Morris | |
| 6,734,539 B2 | 5/2004 | Degani et al. | |
| 6,737,750 B1 * | 5/2004 | Hoffman et al. | 257/777 |
| 6,856,007 B2 | 2/2005 | Warner | |
| 6,933,598 B2 * | 8/2005 | Karnezos | 257/686 |
| 7,537,962 B2 * | 5/2009 | Jang et al. | 438/109 |
| 2004/0063246 A1 | 4/2004 | Karnezos | |

* cited by examiner

*Primary Examiner* — Theresa T Doan
(74) *Attorney, Agent, or Firm* — Mikio Ishimaru

(57) ABSTRACT

A method of manufacture of a shielded stacked integrated circuit packaging system includes forming a first integrated circuit structure having a first substrate and a first integrated circuit die; mounting a shield over the first substrate and the first integrated circuit die; mounting a second integrated circuit structure having a second substrate and a second integrated circuit die over the shield; and forming a package encapsulation for covering the first integrated circuit die, the shield, and the second integrated circuit structure.

16 Claims, 7 Drawing Sheets

SHIELDED STACKED INTEGRATED CIRCUIT PACKAGING SYSTEM AND METHOD OF MANUFACTURE THEREOF

CROSS-REFERENCE TO RELATED APPLICATION(S)

This application is a Continuation of U.S. patent application Ser. No. 11/615,922 filed Dec. 22, 2006, and the subject matter thereof is hereby incorporated herein by reference thereto.

TECHNICAL FIELD

The present invention relates generally to integrated circuit packages and more particularly to shielded stacked integrated circuit packaging system.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, compute servers, and storage servers, need more integrated circuits in the same or smaller "real estate".

Particularly acute, the needs for portable personal electronics, such as cell phones, digital cameras, music players, personal digital assistances, and location-based devices, have further driven the need for integrated circuit density. Modem portable electronic devices require a seamless integration of analog and digital subsystems. High-speed digital systems may switch at a high rate, such as more than on gigahertz. At such switching speeds, switching currents radiate energy (noise) that interferes with sensitive analog circuits. Interference usually takes the form of signal crosstalk.

Electromagnetic interference (EMI) is a generic term for unwanted interference energies either conducted as currents or radiated as electromagnetic fields. EMI can emanate from electronic devices in several ways. Generally, voltages and currents in board mounted, integrated circuits create electric and magnetic fields that radiate from the device. EMI radiating from such devices will vary in field strength and impedance according to the shape and orientation of the conductors, the distance from the conductors to any shielding provided by circuit components or by coupling to circuit components.

As electronic devices and integrated circuits operate at higher and higher frequencies, EMI extends into the radio frequency spectrum and can cause significant interference with radio and television signals.

One typical scheme has been to provide a conductive enclosure to an electronic device so that EMI field lines will terminate on such enclosure. Unfortunately, conductive enclosures that contain the entire product or parts of the product can be very expensive. In addition, the need to increase integrated circuit density has led to the development of multi-chip packages in which more than one integrated circuit can be packaged. Typically, these multi-chip packages have integrated circuits mounted horizontally with each having an EMI shield. This increases the size of the package as well as prohibits stacking configurations of the integrated circuits.

Thus, a need still remains for a shielded stacked integrated circuit packaging system having a shield with low cost manufacturing, improved yield, and decreased size. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of a shielded stacked integrated circuit packaging system including: forming a first integrated circuit structure having a first substrate and a first integrated circuit die; mounting a shield over the first substrate and the first integrated circuit die; mounting a second integrated circuit structure having a second substrate and a second integrated circuit die over the shield; and forming a package encapsulation for covering the first integrated circuit die, the shield, and the second integrated circuit structure.

The present invention provides a shielded stacked integrated circuit packaging system including: a first integrated circuit structure having a first substrate and a first integrated circuit die; a shield over the first substrate and the first integrated circuit die; a second integrated circuit structure having a second substrate and a second integrated circuit die over the shield; an internal interconnect between the first substrate and the second substrate; and a package encapsulation for covering the first integrated circuit die, the shield, and the second integrated circuit structure.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
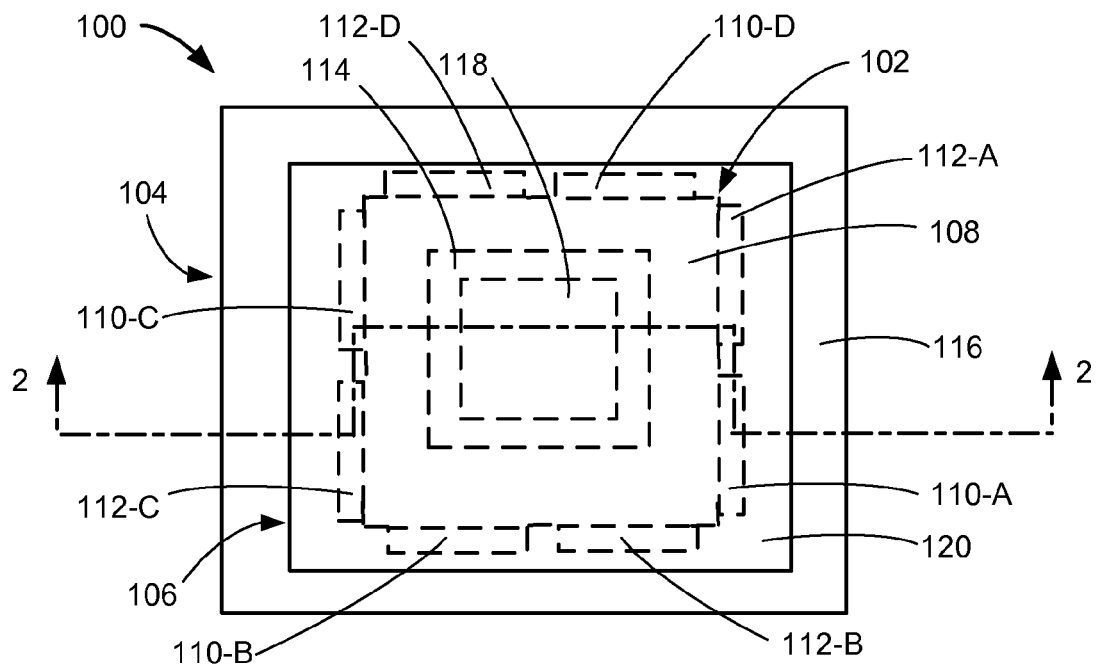
FIG. 1 is a plan view of a shielded stacked integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure.

Referring now to FIG. 1, therein is shown a plan view of a shielded stack integrated circuit packaging system 100 in an embodiment of the present invention. The plan view is shown without an encapsulation. The shielded stack integrated circuit packaging system 100 includes a shield 102, such as a radio frequency (RF) shield, a first integrated circuit structure 104, and a second integrated circuit structure 106.

The shield 102 includes a horizontal portion 108 with first vertical portions 110 (shown as 110-A to 110-D) and second vertical portions 112 (shown as 112-A to 112-D) at the sides of the horizontal portion 108. The first integrated circuit structure 104 includes a first integrated circuit die 114 and a first substrate 116, such as a laminate substrate. The second integrated circuit structure 106 includes a second integrated circuit die 118 and a second substrate 120, such as a laminate substrate.

Figure 2:
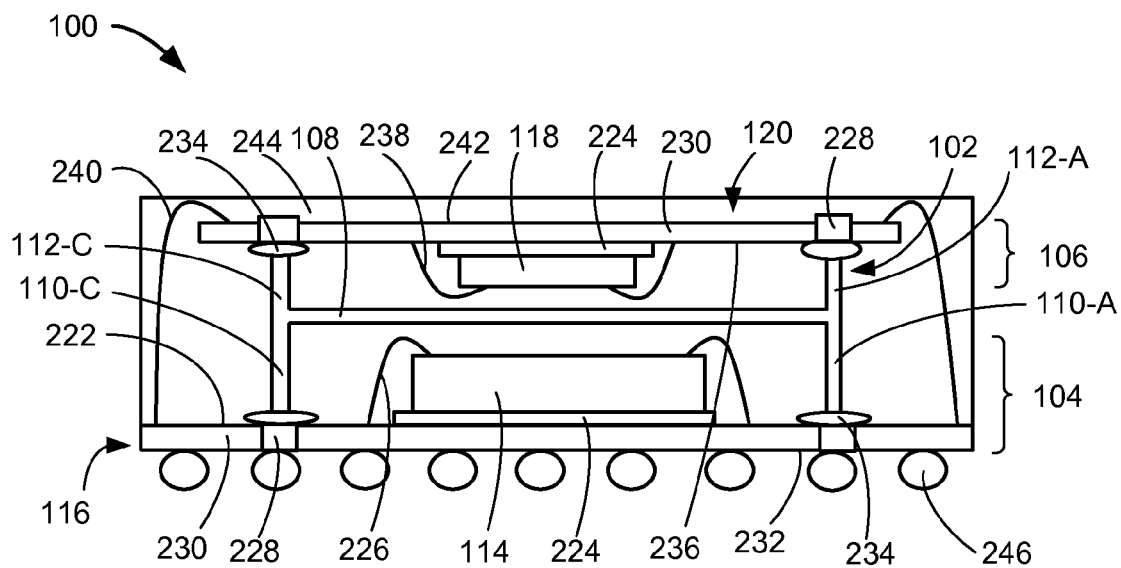
FIG. 2 is a cross-sectional view of the shielded stacked integrated circuit packaging system along a line segment 2-2 of FIG. 1.

Referring now to FIG. 2, therein is shown a cross-sectional view of the shielded stack integrated circuit packaging system 100 along a line segment 2-2 of FIG. 1. The cross-sectional view depicts the shield 102 over the first integrated circuit structure 104 and supporting the second integrated circuit structure 106.

The first integrated circuit structure 104 has the first substrate 116 serving as a package substrate for the shielded stacked integrated circuit packaging system 100. The first integrated circuit structure 104 also include the first integrated circuit die 114 over a first device side 222 of the first substrate 116. A first adhesive 224, such as a die-attach adhesive, attaches the first integrated circuit die 114 and the first device side 222. The first integrated circuit structure 104 further includes first interconnects 226, such as bond wires or ribbon bonds, connecting the first device side 222 and the first integrated circuit die 114.

The first substrate 116 has interlayer conductors 228, such as electrical vias, surrounded by an insulator 230, such as a dielectric. The interlayer conductors 228 provide electrical connections between a first non-device side 232 of the first substrate 116 and the first device side 222 of the first substrate 116. For illustrative purposes, the first substrate 116 is shown having the interlayer conductors 228 and the insulator 230, although it is understood that the first substrate 116 may have other structures, such as contacts (not shown), traces (not shown), and layers (not shown) of the traces. A second adhesive 234, such as a conductive adhesive, attaches the first vertical portions 110-A, 110-C of the shield 102 and the interlayer conductors 228 exposed at the first device side 222.

The second integrated circuit structure 106 has the second integrated circuit die 118 over a second device side 236 of the second substrate 120. The first adhesive 224 attaches the second integrated circuit die 118 and the second device side 236. The second integrated circuit structure 106 also includes second interconnects 238, such as bond wires or ribbon bonds, connecting the second device side 236 and the second integrated circuit die 118.

The second adhesive 234 also attaches the second vertical portions 112-A, 112-C of the shield 102 and the interlayer conductors 228 exposed at the second device side 236. The interlayer conductors 228 of the second substrate 120 are also surrounded by the insulator 230. For illustrative purposes, the second substrate 120 is shown having the interlayer conductors 228 and the insulator 230, although it is understood that the second substrate 120 may have other structures, such as contacts (not shown), traces (not shown), and layers (not shown) of the traces.

The second integrated circuit structure 106 faces the first integrated circuit structure 104 with the second integrated circuit die 118 facing the first integrated circuit die 114. The horizontal portion 108 of the shield 102 is between the first integrated circuit die 114 and the second integrated circuit die 118. The cross-sectional view depicts the first integrated circuit die 114 between the first vertical portions 110-A, 110-C at opposite sides of the horizontal portion 108. The cross-sectional view also depicts the second integrated circuit die 118 between the second vertical portions 112-A, 112-C at opposite sides of the horizontal portion 108.

Third interconnects 240, such as bond wires, connect a second non-device side 242 of the second substrate 120 and the first device side 222 of the first substrate 116. A package encapsulation 244, such as an epoxy mold compound, covers the second integrated circuit structure 106, the shield 102, and the third interconnects 240. The package encapsulation 244 partially covers the first integrated circuit structure 104 covering the first integrated circuit die 114, the first interconnects 226, and the first device side 222 and exposing the first non-device side 232.

External interconnects 246, such as solder balls, connect to the first non-device side 232 and the interlayer conductors 228 exposed at the first non-device side 232. The external interconnects 246 may connect to the next system level (not shown), such as a printed circuit board or an integrated circuit packaging system. The external interconnects 246 connected to a ground (not shown) of the next system level allows the shield 102 to function as a electromagnetic interference (EMI) or radio frequency (RF) shield.

The horizontal portion 108, the first vertical portions 110-A and 110-C, and the second vertical portions 112-A and 112-C of the shield 102 may help form mold locks. The mold lock features prevent delamination of the package encapsulation 244 and improve performance in moisture sensitivity level (MSL) tests.

Figure 3:
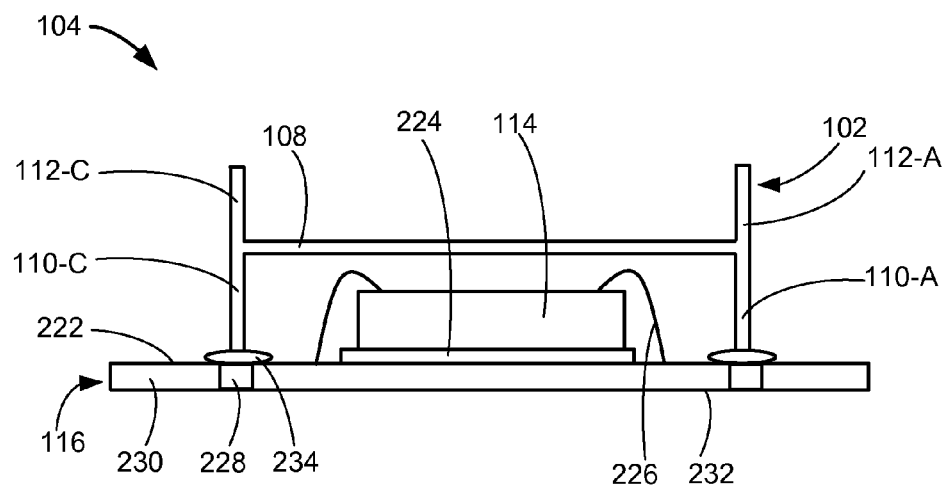
FIG. 3 is a cross-sectional view of the first integrated circuit structure of FIG. 2 in a forming phase.

Referring now to FIG. 3, therein is shown a cross-sectional view of the first integrated circuit structure 104 of FIG. 2 in a forming phase. The cross-sectional view depicts the first substrate 116 having the insulator 230 surrounding the interlayer conductors 228. The interlayer conductors 228 are shown extending from the first non-device side 232 to the first device side 222 of the first substrate 116. The first non-device side 232 and the first device side 222 expose the interlayer conductors 228.

The first integrated circuit die 114 mounts on the first device side 222 with the first adhesive 224. The first interconnects 226 connects the first integrated circuit die 114 and the first device side 222. The first adhesive 224 does not impede the connections of the first interconnects 226 and the first device side 222. For illustrative purposes, the first integrated circuit structure 104 is shown having the first integrated circuit die 114 as a wire bonded integrated circuit die, although it is understood that the first integrated circuit die 114 may be different, such as a flip chip.

The shield 102 mounts over the first device side 222. The second adhesive 234 attaches the first vertical portions 110-A, 110-C of the shield 102 and the interlayer conductors 228 exposed at the first device side 222. The horizontal portion 108 of the shield 102 is over the first integrated circuit die 114 and the first interconnects 226. The cross-sectional view depicts the first integrated circuit die 114 and the first interconnects 226 between the first vertical portions 110-A, 110-C at opposite sides of the horizontal portion 108. The cross-sectional view also depicts the second vertical portions 112-A, 112-C of the shield 102 extending above the horizontal portion 108.

Figure 4:
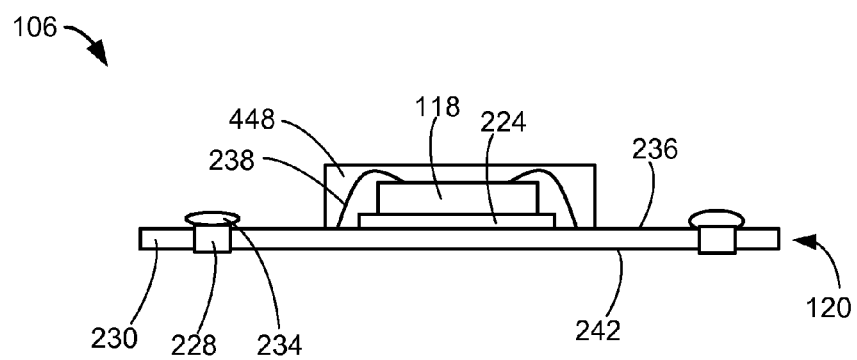
FIG. 4 is a cross-sectional view of the second integrated circuit structure of FIG. 2 in a forming phase.

Referring now to FIG. 4, therein is shown a cross-sectional view of the second integrated circuit structure 106 of FIG. 2 in a forming phase. The cross-sectional view depicts the second substrate 120 having the insulator 230 surrounding the interlayer conductors 228. The interlayer conductors 228 are shown extending from the second non-device side 242 to the second device side 236 of the second substrate 120. The second non-device side 242 and the second device side 236 expose the interlayer conductors 228.

The second integrated circuit die 118 mounts on the second device side 236 with the first adhesive 224. The second interconnects 238 connects the second integrated circuit die 118 and the second device side 236. The first adhesive 224 does not impede the connections of the second interconnects 238 and the second device side 236. The second adhesive 234 is applied on the interlayer conductors 228 exposed at the second device side 236.

A gate encapsulation 448, such as a top gate mold comprised of an epoxy mold compound, covers the second integrated circuit die 118 and the second interconnects 238. The gate encapsulation 448 partially covers the second device side 236 without impeding the second adhesive 234. The gate encapsulation 448 may be formed by a number of different processes, such as center gate injection molding or compression molding.

For illustrative purposes, the second integrated circuit structure 106 is shown having the second integrated circuit die 118 as a wire bonded integrated circuit die, although it is understood that the second integrated circuit die 118 may be different, such as a flip chip. Also for illustrative purposes, the second integrated circuit structure 106 is shown having the gate encapsulation 448, although it is understood that the second integrated circuit structure 106 may not have the gate encapsulation 448 or may have a different encapsulation configuration.

Figure 5:
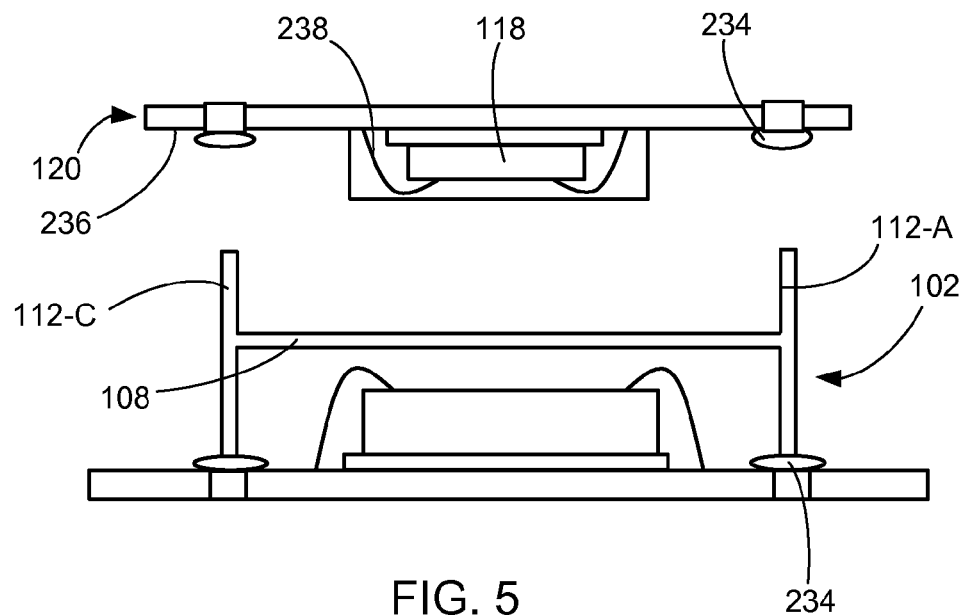
FIG. 5 is the structure of FIG. 3 and FIG. 4 in an attaching phase.

Referring now to FIG. 5, therein is shown the structure of FIG. 3 and FIG. 4 in an attaching phase. The second integrated circuit structure 106 of FIG. 4 is in a vertically flipped orientation and is shown mounting over the first integrated circuit structure 104 of FIG. 3.

The second adhesive 234 of the second substrate 120 attaches the second vertical portions 112-A, 112-C of the shield 102 and the second device side 236. The shield 102 also functions as a spacer between the first integrated circuit structure 104 and the second integrated circuit structure 106.

This cross-sectional view depicts the second integrated circuit die 118 and the second interconnects 238 above the horizontal portion 108 of the shield 102. The cross-sectional view also depicts the second integrated circuit die 118 and the second interconnects 238 between the second vertical portions 112-A, 112-C of the shield 102 at opposite sides of the horizontal portion 108.

Figure 6:
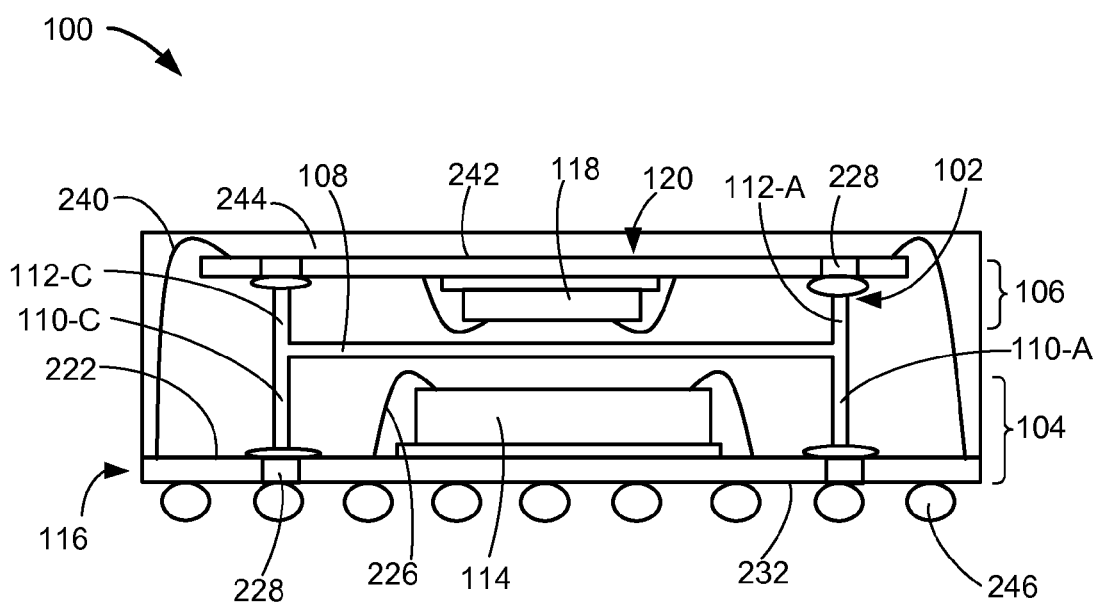
FIG. 6 is the structure of FIG. 5 in an encapsulation-forming phase.

Referring now to FIG. 6, therein is shown the structure of FIG. 5 in an encapsulation-forming phase. The second integrated circuit structure 106 is over the first integrated circuit structure 104 with the shield 102 in between. The horizontal portion 108 of the shield 102 is between the first integrated circuit die 114 and the second integrated circuit die 118. The first vertical portions 110-A, 110-C and the second vertical portions 112-A, 112-C support the second integrated circuit structure 106 over the first integrated circuit structure 104. The third interconnects 240 connect the second integrated circuit structure 106 and the first integrated circuit structure 104 with the second non-device side 242 of the second substrate 120 and the first device side 222 of the first substrate 116.

The package encapsulation 244 covers the second integrated circuit structure 106, the shield 102, and the third interconnects 240. The package encapsulation 244 partially covers the first integrated circuit structure 104 covering the first integrated circuit die 114, the first interconnects 226, and the first device side 222 and exposing the first non-device side 232. The external interconnects 246 attaches with the first non-device side 232 and the interlayer conductors 228 exposed at the first non-device side 232 forming the shielded stacked integrated circuit packaging system 100.

Figure 7:
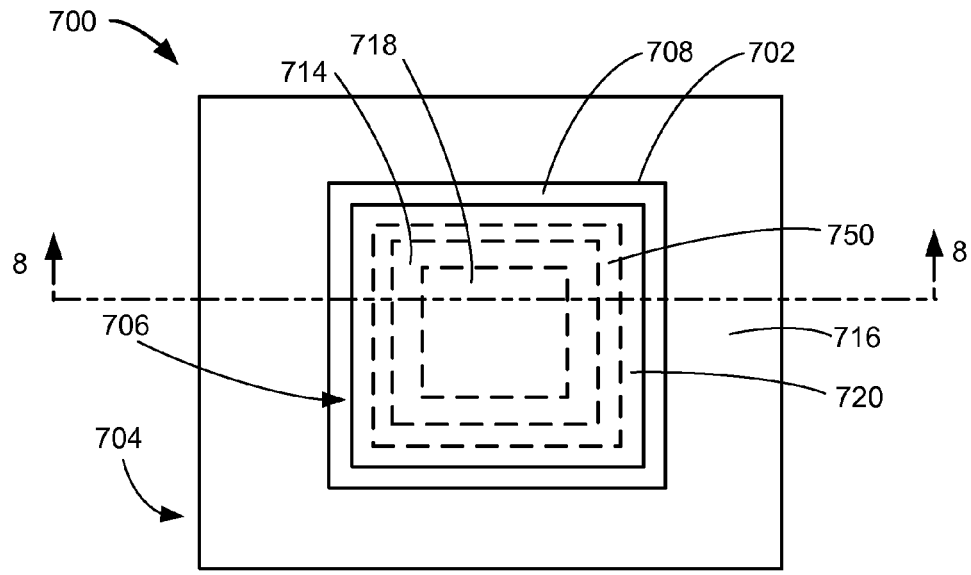
FIG. 7 is a plan view of a shielded stacked integrated circuit packaging system in an alternative embodiment of the present invention.

Referring now to FIG. 7, therein is shown a plan view of a shielded stacked integrated circuit packaging system 700 in an alternative embodiment of the present invention. The plan view is without an encapsulation. The shielded stacked integrated circuit packaging system 700 includes a shield 702, such as a radio frequency (RF) shield, a first integrated circuit structure 704, and a second integrated circuit structure 706.

The shield 702 includes a horizontal portion 708 and a recess 750 in the horizontal portion 708. The first integrated circuit structure 704 includes a first integrated circuit die 714 and a first substrate 716, such as a laminate substrate. The second integrated circuit structure 706 includes a second integrated circuit die 718 and a second substrate 720, such as a laminate substrate. The second integrated circuit die 718 is in the recess 750. The plan view depicts the boundary of the second substrate 720 is within the boundary of the shield 702.

Figure 8:
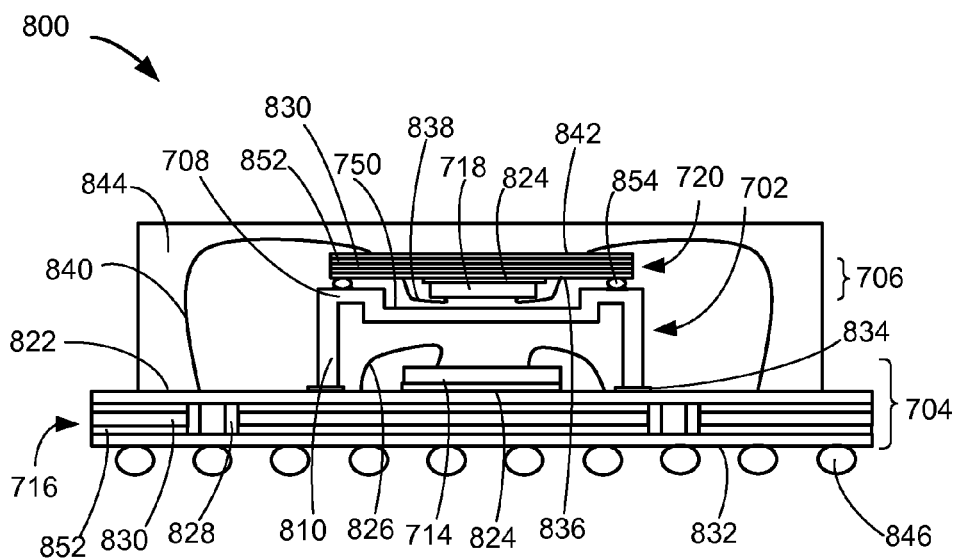
FIG. 8 is a cross-sectional view of the shielded stacked integrated circuit packaging system along a line segment 8-8 of FIG. 7.

Referring now to FIG. 8, therein is shown a cross-sectional view of the shielded stacked integrated circuit packaging system 700 along a line segment 8-8 of FIG. 7. The cross-sectional view depicts the shield 702 over the first integrated circuit structure 704 and supporting the second integrated circuit structure 706.

The first integrated circuit structure 704 has the first substrate 716 serving as a package substrate for a shielded stacked integrated circuit packaging system 800. The first integrated circuit structure 704 also include the first integrated circuit die 714 over a first device side 822 of the first substrate 716. A first adhesive 824, such as a die-attach adhesive, attaches the first integrated circuit die 714 and the first device side 822. The first integrated circuit structure 704 further includes first interconnects 826, such as bond wires or ribbon bonds, connecting the first device side 822 and the first integrated circuit die 714.

The first substrate 716 has interlayer conductors 828, such as electrical vias, surrounded by an insulator 830, such as a dielectric. The interlayer conductors 828 may provide electrical connections between a first non-device side 832 of the first substrate 716 and the first device side 822 of the first substrate 716. The first substrate 716 also has traces 852, such as conductive lines, for signal routing.

The traces 852 may be between multiple layers of the insulator 830. The interlayer conductors 828 may connect layers of the traces 852 to one another. For illustrative purposes, the first substrate 716 is shown having the interlayer conductors 828, the insulator 830, and the traces 852, although it is understood that the first substrate 716 may have other structures, such as contacts (not shown).

The shield 702 has first vertical portions 810 along the sides of the horizontal portion 708. The horizontal portion 708 has the recess 750. A second adhesive 834, such as a conductive adhesive, attaches the multiple instances of the first vertical portions 810 of the shield 702 and the first device side 822.

The cross-sectional view depicts the first integrated circuit die 714 and the first interconnects 826 between the first vertical portions 810. The horizontal portion 708 and the recess 750 are above the first integrated circuit die 714 and the first interconnects 826.

The second integrated circuit structure 706 has the second integrated circuit die 718 over a second device side 836 of the second substrate 720. The first adhesive 824 attaches the second integrated circuit die 718 and the second device side 836. The second integrated circuit structure 706 also includes second interconnects 838, such as bond wires or ribbon bonds, connecting the second device side 836 and the second integrated circuit die 718.

The second substrate 720 may have structural similarities with the first substrate 716. The second substrate 720 has the traces 852 and layers of the traces 852 for routing signals. The traces 852 are between layers of the insulator 830. For illustrative purposes, the second substrate 720 is shown having the traces 852 and the insulator 830, although it is understood that the second substrate 720 may have other structures, such as contacts (not shown) and the interlayer conductors 828 as shown of the first substrate 716.

The second integrated circuit structure 706 faces the first integrated circuit structure 704 with the second integrated circuit die 718 facing the first integrated circuit die 714. The horizontal portion 708 of the shield 702 is between the first integrated circuit die 714 and the second integrated circuit die 718. The cross-sectional view also depicts the second integrated circuit die 718 and the second interconnects 838 partially in the recess 750. The second integrated circuit structure 706 mounts over the non-recessed portion of the horizontal portion 708 with supports 854, such as spacers or solder balls, between the second device side 836 and the horizontal portion 708.

For example, the supports 854 as conductive supports may provide ground connections between the shield 702 and the second integrated circuit structure 706. As an alternative example, the supports 854 as spacers may provide the vertical clearance such that the second integrated circuit die 718 and the second interconnects 838 do not contact the horizontal portion 708 in the recess 750.

Third interconnects 840, such as bond wires, connect a second non-device side 842 of the second substrate 720 and the first device side 822 of the first substrate 716. A package encapsulation 844, such as an epoxy mold compound, covers the second integrated circuit structure 706, the shield 702, and the third interconnects 840. The package encapsulation 844 partially covers the first integrated circuit structure 704 covering the first integrated circuit die 714, the first interconnects 826, and the first device side 822 and exposing the first non-device side 832.

External interconnects 846, such as solder balls, connect to the first non-device side 832. The external interconnects 846 may connect to the next system level (not shown), such as a printed circuit board or an integrated circuit packaging system. The external interconnects 846 connected to a ground (not shown) of the next system level allows the shield 702 to function as a electromagnetic interference (EMI) or radio frequency (RF) shield.

The horizontal portion 708, the first vertical portions 810, and the recess 750 of the shield 702 may help form mold locks. The mold lock features prevent delamination of the package encapsulation 844 and improve performance in moisture sensitivity level (MSL) tests.

Figure 9:
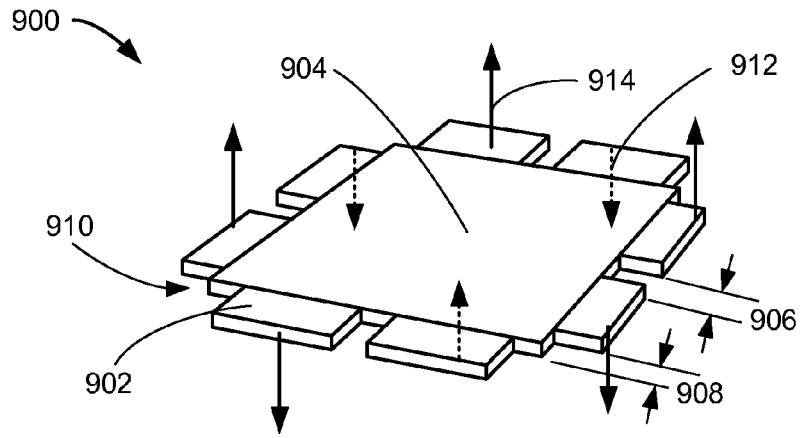
FIG. 9 is an isometric view of a patterned sheet in an embodiment of the present invention.

Referring now to FIG. 9, therein is shown an isometric view of a patterned sheet 900 in an embodiment of the present invention. The patterned sheet 900 depicts extensions 902 along each side of a center portion 904. The extensions 902 along the same side of the center portion 904 have a gap 906. The extensions 902 also have a space 908 from corners 910 of the center portion 904.

The patterned sheet 900 may be formed by a number of different processes, such as stamping or etching. The patterned sheet 900 may be formed from a number of different materials, such as an electrically conductive and malleable material, to withstand the force applied to the extensions 902 without cracking or breaking. First arrows 912 and second arrows 914 depict the direction of the force applied on the respective instance of the extensions 902.

Figure 10:
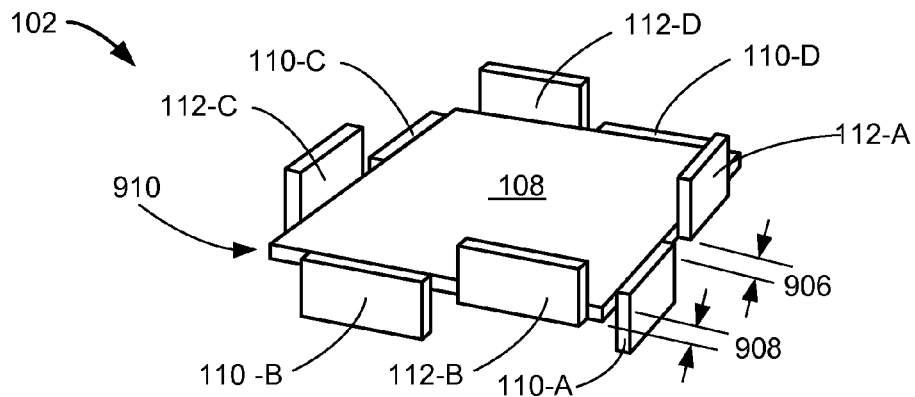
FIG. 10 is the structure of FIG. 9 in a forming phase.

Referring now to FIG. 10, therein is shown the structure of FIG. 9 in a forming phase. The patterned sheet 900 of FIG. 9 undergoes bending forces applied to the extensions 902 of FIG. 9 as depicted by the first arrows 912 of FIG. 9 and the second arrows 914 of FIG. 9 forming the shield 102.

The shield 102 has the horizontal portion 108 formed from the center portion 904 of FIG. 9. The shield 102 also has the first vertical portions 110-A to 110-D and the second vertical portions 112-A to 112-D along the sides of the horizontal portion 108. The first vertical portions 110-A to 110-D extend below the horizontal portion 108 and the second vertical portions 112-A to 112-D extend above the horizontal portion 108. The gap 906 and the space 908 at the corners 910 provide paths for mold flow.

Referring now to FIG. 1, therein is shown an isometric view of a shield 1100 in an alternative embodiment of the present invention. The shield 1100 may be formed similarly to the shield 102 of FIG. 10. The shield 1100 may also have substantially the same structure as the shield 102 with holes 1102. The holes 1102 may provide channels for mold flow in addition to a gap 1106 and a space 1108. The holes 1102 may also provide additional mold lock features.

Figure 12:
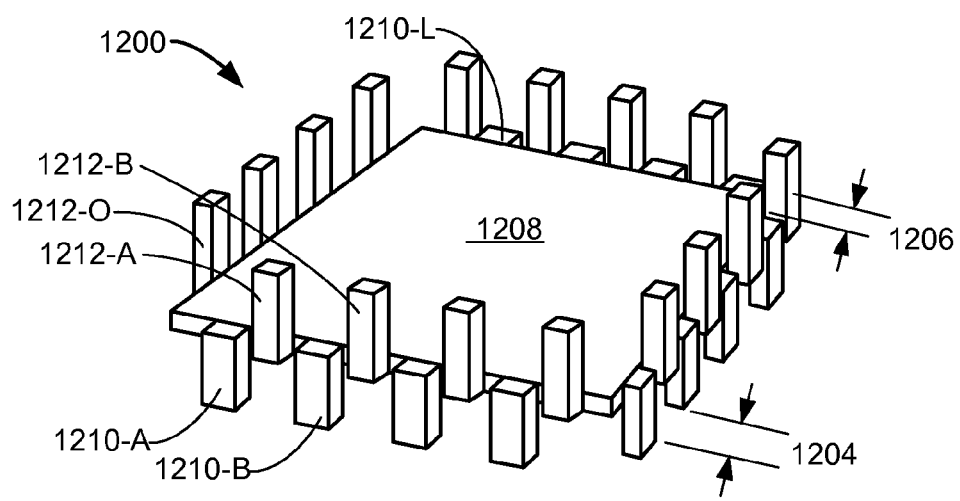
FIG. 12 is an isometric view of a shield in another alternative embodiment of the present invention.

Referring now to FIG. 12, therein is shown an isometric view of a shield 1200 in another alternative embodiment of the present invention. The shield 1200 may be formed in a number of different processes, such as a process described in FIG. 9 and FIG. 10 or attaching separate portions. The shield 1200 has a horizontal portion 1208, first vertical portions 1210 (shown as 1210-A to 1210-L), and second vertical portions 1212 (shown as 1212-A to 1212-O). Multiple instances of the first vertical portions 1210-A to 1210-L and the second vertical portions 1212-A to 1212-O are along each side of the horizontal portion 1208 in an alternating configuration. The first vertical portions 1210-A to 1210-L extend below the horizontal portion 1208 and the second vertical portions 1212-A to 1212-O extend above the horizontal portion 1208.

The first vertical portions 1210-A to 1210-L along each side of the horizontal portion 1208 have a first gap 1204 in between. The second vertical portions 1212-A to 1212-O along each side of the horizontal portion 108 has a second gap 1206 in between. The first gap 1204 and the second gap 1206 provide paths for mold flow.

Figure 13:
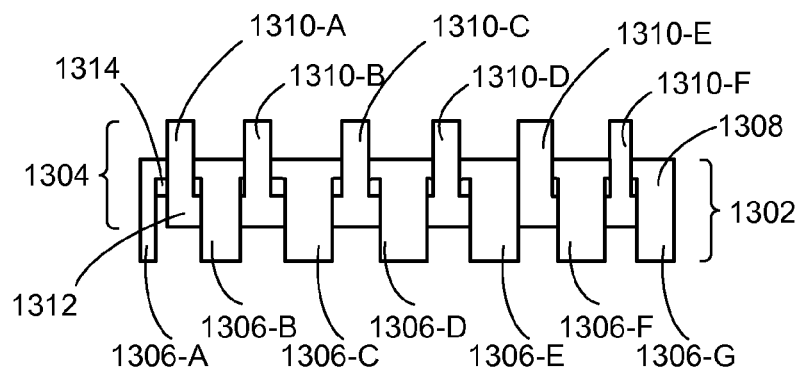
FIG. 13 is a front view of the shield of FIG. 12.

Referring now to FIG. 13, therein is shown a front view of the shield 1200 of FIG. 12. The front view depicts a first portion 1302 and a second portion 1304 of the shield 1200. The first portion 1302 has first vertical portions 1306-A to 1306-G and a first planar portion 1308. The second portion 1304 has second vertical portions 1310-A to 1310-F and a second planar portion 1312.

The first portion 1302 attaches with the second portion 1304 with an adhesive 1314, such as a conductive adhesive, between the first planar portion 1308 and the second planar portion 1312. The first planar portion 1308 and the second planar portion 1312 attached forms the horizontal portion 1208 of FIG. 12. The first vertical portions 1306-A to 1306-G and the second vertical portions 1310-A to 1310-F are in complementary location such that the first vertical portions 1306-A to 1306-G and the second vertical portions 1310-A to 1310-F do not impede the attachment of the first portion 1302 and the second portion 1304.

Figure 14:
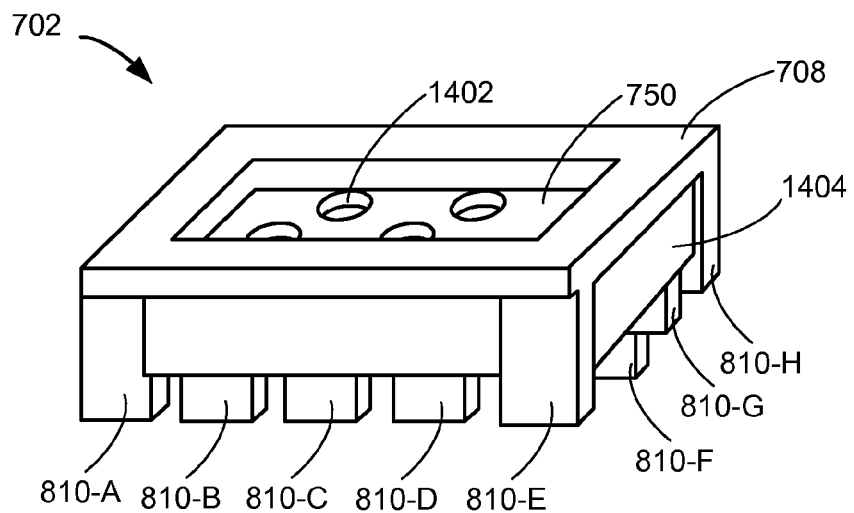
FIG. 14 is an isometric view of the shield of FIG. 7.

Referring now to FIG. 14, therein is shown an isometric view of the shield 702 of FIG. 7. The isometric view depicts the horizontal portion 708, the recess 750, and the first vertical portions 810 (shown as 810-A to 810-H) along the sides of the shield 702. The isometric view also depicts holes 1402 in the horizontal portion 708 in the recess 750 and side panels 1404 between the sides of the horizontal portion 708 and the first vertical portions 810. The holes 1402 provide channels for mold flow and may also function as mold locks. The side panels 1404 provide additional shielding along the sides of the shield 702 beyond the first vertical portions 810 extending from the horizontal portion 708. The side panels 1404 may also form mold locks.

Figure 15:
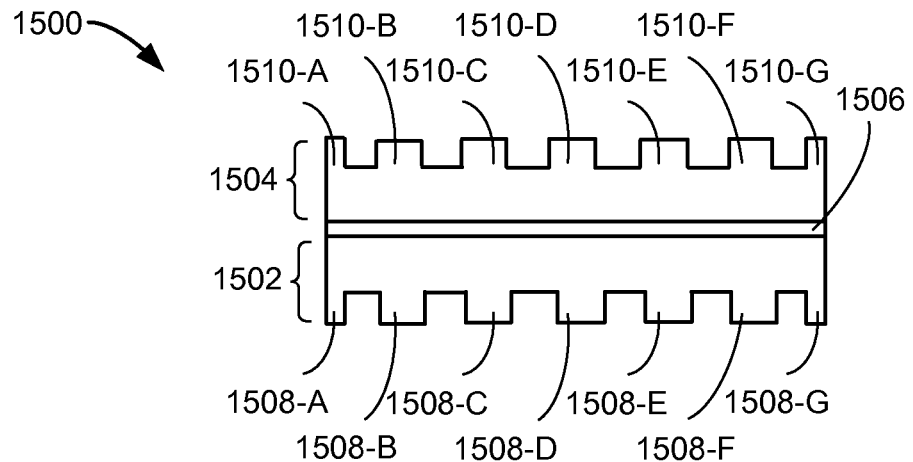
FIG. 15 is a front view of a shield in yet another alternative embodiment of the present invention.

Referring now to FIG. 15, therein is shown a front view of a shield 1500 in yet another alternative embodiment of the present invention. The shield 1500 has a first portion 1502 attached below a second portion 1504 with an adhesive 1506, such as a conductive adhesive. The first portion 1502 and the second portion 1504 may represent multiple instances of the shield 702 of FIG. 14. The first portion 1502 has first vertical portions 1508 (shown as 1508-A to 1508-G) and the second portion 1504 has second vertical portions 1510 (shown as 1510-A to 1510-G).

Figure 16:
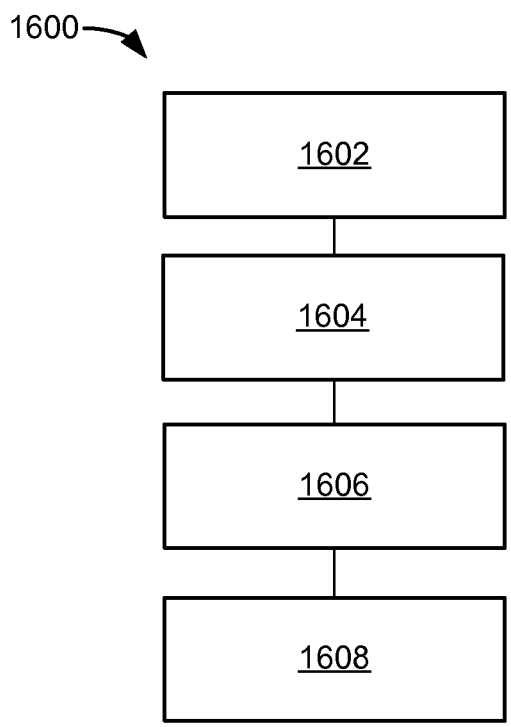
FIG. 16 is a flow chart of a method of manufacture of a shielded stacked integrated circuit packaging system in a further embodiment of the present invention.

Referring now to FIG. 16, therein is shown a flow chart of a method 1600 of manufacture of a shielded stacked integrated circuit packaging system 100 in a further embodiment of the present invention. The method 1600 includes forming a first integrated circuit structure having a first substrate and a first integrated circuit die in a block 1602; mounting a shield over the first substrate and the first integrated circuit die in a block 1604; mounting a second integrated circuit structure having a second substrate and a second integrated circuit die over the shield in a block 1606; and forming a package encapsulation for covering the first integrated circuit die, the shield, and the second integrated circuit structure in a block 1608.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the shielded stacked integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of a shielded stacked integrated circuit packaging system comprising:
   forming a first integrated circuit structure having a first substrate and a first integrated circuit die;
   forming a shield including a horizontal portion having a first vertical portion extended below the horizontal portion and a second vertical portion extended above the horizontal portion;
   mounting the shield over the first substrate and the first integrated circuit die;
   mounting a second integrated circuit structure having a second substrate and a second integrated circuit die over the shield, with the second substrate on the second vertical portion and the second integrated circuit die facing the first integrated circuit die; and
   forming a package encapsulation for covering the first integrated circuit die, the shield, and the second integrated circuit structure.

2. The method as claimed in claim 1 wherein forming the shield includes forming the horizontal portion having the first vertical portion extended below the horizontal portion and a recess therein.

3. The method as claimed in claim 1 wherein:
   forming the shield includes forming a horizontal portion having a first vertical portion extended below the horizontal portion and a recess therein; and
   mounting the second integrated circuit structure includes:
     placing the second integrated circuit die partially in the recess.

4. A method of manufacture of a shielded stacked integrated circuit packaging system comprising:

forming a first integrated circuit structure having a first substrate and a first integrated circuit die attached on the first substrate;

mounting a shield on the first substrate with an adhesive and over the first integrated circuit die;

mounting a second integrated circuit structure having a second substrate and a second integrated circuit die over the shield, the second integrated circuit die attached on the second substrate; and forming a package encapsulation for covering the first integrated circuit die, the shield, the second integrated circuit structure, and a first device side of the first substrate.

5. The method as claimed in claim 4 further comprising attaching an external interconnect with a first non-device side of the first substrate.

6. The method as claimed in claim 4 further comprising connecting an external interconnect with a first non-device side of the first substrate and the shield for grounding.

7. The method as claimed in claim 4 further comprising forming the shield includes:

forming a first portion having a first vertical portion;

forming a second portion having a second vertical portion; and attaching the first portion and the second portion.

8. The method as claimed in claim 4 further comprising forming the shield having a hole.

9. A shielded stacked integrated circuit packaging system comprising:

a first integrated circuit structure having a first substrate and a first integrated circuit die;

a second integrated circuit structure having a second substrate and a second integrated circuit die over the shield;

a shield over the first substrate and the first integrated circuit die, the shield including a horizontal portion having a first vertical portion extended below the horizontal portion and a second vertical portion extended above the horizontal portion with the second substrate on the second vertical portion with the second integrated circuit die facing the first integrated circuit die;

an internal interconnect between the first substrate and the second substrate; and a package encapsulation for covering the first integrated circuit die, the shield, and the second integrated circuit structure.

10. The system as claimed in claim 9 wherein the shield includes a horizontal portion having a first vertical portion extended below the horizontal portion and a recess therein.

11. The system as claimed in claim 9 wherein the shield includes a horizontal portion having a first vertical portion extended below the horizontal portion and a recess therein with the second integrated circuit die partially in the recess.

12. The system as claimed in claim 9 wherein:

the first integrated circuit structure has the first substrate and the first integrated circuit die attached with the first substrate with a first adhesive;

the shield is attached to the first substrate with a second adhesive and over the first integrated circuit die;

the second integrated circuit structure has the second substrate and the second integrated circuit die over the shield with the second integrated circuit die attached to the second substrate with the first adhesive;

the internal interconnect is a bond wire between the first substrate and the second substrate; and the package encapsulation is a cover for the first integrated circuit die, the shield, the second integrated circuit structure, and a first device side of the first substrate.

13. The system as claimed in claim 12 further comprising an external interconnect attached to a first non-device side of the first substrate.

14. The system as claimed in claim 12 further comprising an external interconnect connected with a first non-device side of the first substrate and the shield for grounding.

15. The system as claimed in claim 12 wherein the shield includes:

a first portion having a first vertical portion; and a second portion, having a second vertical portion, is attached with the first portion.

16. The system as claimed in claim 12 wherein the shield includes a hole.

* * * * *

UNITED STATES PATENT AND TRADEMARK OFFICE
CERTIFICATE OF CORRECTION

PATENT NO. : 8,018,040 B2  
APPLICATION NO. : 12/423320  
DATED : September 13, 2011  
INVENTOR(S) : Jang et al.

Page 1 of 1

Figure 11:
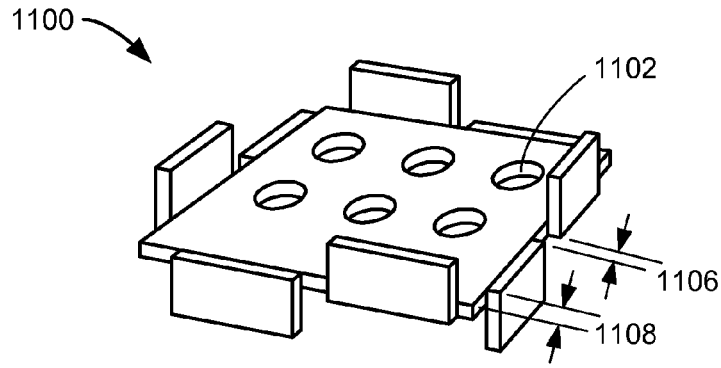
FIG. 11 is an isometric view of a shield in an alternative embodiment of the present invention.

It is certified that error appears in the above-identified patent and that said Letters Patent is hereby corrected as shown below:

<u>Column 8:</u> line 64, delete "FIG. 1" and insert therefor --FIG. 11--

Signed and Sealed this  
Tenth Day of April, 2012

David J. Kappos  
*Director of the United States Patent and Trademark Office*